United States Patent
Manabe et al.

(10) Patent No.: US 6,774,088 B2
(45) Date of Patent: Aug. 10, 2004

(54) RARE EARTH-BA-CU COMPLEX COMPOSITION AND METHOD OF PRODUCING SUPERCONDUCTOR USING SAME

(75) Inventors: Takaaki Manabe, Tsukuba (JP); Iwao Yamaguchi, Tsukuba (JP); Tetsuo Tsuchiya, Ushiku (JP); Toshiya Kumagai, Tsukuba (JP); Susumu Mizuta, Tsukuba (JP); Susumu Nakamura, Tsukuba (JP)

(73) Assignee: National Institute of Advanced Industrial Science and Technology (JP)

( * ) Notice: Subject to any disclaimer, the term of this patent is extended or adjusted under 35 U.S.C. 154(b) by 296 days.

(21) Appl. No.: 10/086,377

(22) Filed: Mar. 4, 2002

(65) Prior Publication Data

US 2002/0139960 A1 Oct. 3, 2002

(30) Foreign Application Priority Data

Mar. 27, 2001 (JP) ........................................ 2001-090925

(51) Int. Cl.⁷ .......................... H01B 1/00; H01L 39/12; C01G 3/02; B05D 5/12
(52) U.S. Cl. .......................... 505/1; 505/700; 505/734; 505/741; 252/500; 252/519.1; 428/702; 427/62; 427/226
(58) Field of Search ............................ 252/500, 519.1; 505/1, 700, 734, 741, 445, 512; 427/62, 226; 428/702

(56) References Cited

U.S. PATENT DOCUMENTS 5,039,654 A * 8/1991 Mizuta et al. ............... 505/233

FOREIGN PATENT DOCUMENTS

JP 2002-080297 * 3/2002 ........... C30B/29/22

OTHER PUBLICATIONS

Gupta et al, "Superconducting Oxide Films With High Transition Temperature Prepared from Metal Trifluoroacetae Precursors", Appl. Phys. Lett. 1988, 52(24), pp. 2077–2079.*

* cited by examiner

Primary Examiner—Mark Kopec
Assistant Examiner—Kallambella Vijayakumar
(74) Attorney, Agent, or Firm—Lorusso, Loud & Kelly

(57) ABSTRACT

A metal complex composition containing complexes having metal species of a rare earth element, barium and copper and ligands of a trifluoroacetic acid or pentafluoropropionic acid ligand, a pyridine ligand and an acetylacetone ligand. A superconductive film may be obtained by applying an organic solvent solution of the above metal complex composition to a substrate and by heat treating the coating.

21 Claims, No Drawings

RARE EARTH-BA-CU COMPLEX COMPOSITION AND METHOD OF PRODUCING SUPERCONDUCTOR USING SAME

BACKGROUND OF THE INVENTION

1. Field of the Invention

This invention relates generally to a metal complex composition and, more specifically, to a RE—Ba—Cu (RE: a rare earth element) complex composition suitable as a precursor of a superconducting material such as Y-123 and Y124. The present invention is also directed to a process for the fabrication of a superconductor by a coating method.

2. Description of Prior Art

U.S. Pat. No. 5,039,654 (filed Nov. 9, 1987 by Mizuta et al) discloses a method of preparing a superconductive material having a metal oxide superconductor layer provided on a substrate. The method includes dissolving a blend of organic group-containing metal compounds in an organic solvent to form a precursor solution containing metal constituents in a stoichiometry nearly equal to that of the final metal oxide superconductor, and applying the precursor solution on the substrate. The coating is then dried and calcined to form the metal oxide superconductor layer. The above method, which is simple and economical and can produce an oxide film having a uniform thickness, a uniform composition and a large size, has been also utilized for the formation of an epitaxial metal oxide film on a single crystal substrate.

Similar techniques have been thereafter proposed by A. Gupta et al (Appl. Phys. Lett., 52 (1988) 2077, by P. C. McIntyre et al (J. Mater. Res., 5 (1990) 2771) and by Superconductivity Research Laboratory of International Superconductivity Technology Center, in which an organic solvent solution of trifluoroacetic acid salts of metals is used as a precursor coating liquid and in which calcination of the coating is performed in a steam-containing atmosphere. It is considered that a precursor of fluorine-containing components produced during calcination serves to facilitate the formation of a highly oriented superconductive phase.

SUMMARY OF THE INVENTION

It has been found that the coating liquid containing trifluoroacetic acid salts of metals has a problem because a substrate made of a metal or a metal oxide such as nickel, silver, nickel oxide or magnesium oxide is corroded with the coating liquid having a strong acidity. Additionally, when the coating and subsequent pre-calcination are repeated several times to form a coating having a relatively large thickness, the pre-calcined coating is apt to be dissolved in the newly applied coating liquid. The corrosion and dissolution adversely affect the smoothness of the superconductive film as well as uniformity in composition of the film.

It is, therefore, the primary object of the present invention to provide a metal complex composition which is useful as a raw material for the production of a Y123-type or Y124-type superconductive phase.

Another object of the present invention is to provide a metal complex composition of the above-mentioned type which, in the form of an organic solvent solution, is neutral and stable and does not corrode or dissolve a metal or a metal oxide.

It is a further object of the present invention to provide a metal complex composition which can form a large thickness superconductive layer on any conventionally employed substrate.

In accomplishing the foregoing object, there is provided in accordance with the present invention a metal complex composition which comprises complexes of metal species including a rare earth element, barium and copper, wherein the complexes have ligands of (a) trifluoroacetic acid or pentafluoropropionic acid, (b) pyridine and (c) acetylacetone coordinated with the metal species.

In another aspect, the present invention provides a method of preparing the above metal complex composition, comprising the steps of:

(a) providing a solution comprising (A) a rare earth element salt selected from the group consisting of an acetylacetonate, a trifluoroacetate and a pentafluoropropionate, (B) a barium salt selected from the group consisting of an acetylacetonate, a trifluoroacetate and a pentafluoropropionate and (C) a copper salt selected from the group consisting of an acetylacetonate, a trifluoroacetate and a pentafluoropropionate dissolved in a mixed solvent including pyridine and at least one member selected from the group consisting of acetylacetone, trifluoroacetic acid and pentafluoropropionic acid such that said solution contains acetylacetone and at least one of trifluoroacetic acid and pentafluoropropionic acid, and (b) removing the mixed solvent from said solution to obtain the above metal complex composition as a solid phase.

In a further aspect, the present invention provides a method of preparing the above metal complex composition, comprising the steps of:

comprising providing an acidic solution of trifluoroacetic acid or pentafluoropropionic acid salts of a rare earth element, barium and copper dissolved in an organic solvent, and mixing said solution with pyridine and acetylacetone to obtain the above metal complex composition in the form of a neutral solution.

The present invention also provides a process for the preparation of a superconductor, comprising the steps of:

(a) applying an organic solvent solution of the above metal complex composition to a substrate to form a coating thereon; and (b) heat treating said coating at a temperature and for a period of time sufficient to form a superconductive phase.

Trifluoroacetic acid or pentafluoropropionic acid has two oxygen atoms which can be coordinated to the same metal ion or two different metal ions. The pyridine ligand has one nitrogen atom in the pyridine ring which can be coordinated to one metal ion. Acetylacetone has two oxygen atoms which can be coordinated to the same metal ion or two different metal ions. Further, one or a plurality of ligands may be coordinated to the rare earth element ion, barium ion and copper ion. For example, one rare earth element ion can be coordinated with at most three pyridine ligands, at most six different ligands of acetylacetone, trifluoroacetic acid or pentafluoropropionic acid.

Thus, in the composition of the present invention, two or more, same or different metal ions may be indirectly linked at random to each other through the trifluoroacetic acid or pentafluoropropionic acid ligand and the acetylacetone ligand. The fact that a solution of the composition does not segregate crystals but forms an amorphous solid (glass) when the solvent is removed to dryness is considered to be ascribed to the above coordination structure which prevents regular arrangement of metal species.

Other objects, features and advantages of the present invention will become apparent from the detailed description of the preferred embodiments of the invention to follow.

DETAILED DESCRIPTION OF THE PREFERRED EMBODIMENTS OF THE INVENTION

The metal complex composition according to the present invention comprises complexes of metal species including a rare earth element (RE), barium (Ba) and copper (Cu). The complexes have ligands of (a) trifluoroacetic acid or pentafluoropropionic acid, (b) pyridine and (c) acetylacetone coordinated with the metal species.

The rare earth element (RE) may be scandium (Sc), yttrium (Y) or a lanthanide selected from lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu).

The metal species may contain one or more metals such as strontium (Sr) and calcium (Ca).

The metal complex composition according to the present invention may be prepared as follows.

In a first step, a solution of (A) a rare earth element salt selected from an acetylacetonate, a trifluoroacetate and a pentafluoropropionate, (B) a barium salt selected from an acetylacetonate, a trifluoroacetate and a pentafluoropropionate and (C) a copper salt selected from an acetylacetonate, a trifluoroacetate and a pentafluoropropionate which are dissolved in a mixed solvent including pyridine and at least one of acetylacetone, trifluoroacetic acid and pentafluoropropionic acid is prepared.

In this case, it is important that the solvent should be selected so that pyridine, acetylacetone and at least one of trifluoroacetic acid and pentafluoropropionic acid are present in the solution prepared.

The first step may be preferably carried out by dissolving a mixture containing acetylacetonates of a rare earth element, barium and copper in pyridine and in an organic acid selected from trifluoroacetic acid and pentafluoropropionic acid. The first step may be also preferably carried out by dissolving a mixture containing organic acid salts of a rare earth element, barium and copper in pyridine and in acetylacetone, wherein the organic acid is selected from trifluoroacetic acid and pentafluoropropionic acid. The first step may be performed in any other desired method as long as a solution containing RE, Ba and Cu components, pyridine, acetylacetone and at least one of trifluoroacetic acid and pentafluoropropionic acid can be formed. For example, Re, Ba and Cu salts may be separately dissolved in different solvents and the resulting solutions are mixed together with or without one or more additional solvents. If desired, an organic solvent such as a lower alcohol (e.g. methanol, ethanol, propanol or butanol), ketone (e.g. acetone) or ether may be additionally used to dissolve the mixture.

If desired, the solution may additionally contains at least one salt selected from calcium acetylacetonate, calcium trifluoroacetate, calcium pentafluoropropionate, strontium acetylacetonate, strontium trifluoroacetate and strontium pentafluoropropionate.

In the next step, the mixed solvent (excess solvent) is removed from the solution to obtain the metal complex composition of the present invention in the form of a solid. The thus obtained metal complex composition is soluble in water, a lower alcohol having 2–4 carbon atoms, a ketone such as acetone or an ether to give a dark green solvent solution which is nearly neutral (pH: about 6–7) in nature.

The metal complex composition according to the present invention may be also prepared as follows. First, an acidic solution of trifluoroacetic acid or pentafluoropropionic acid salts of a rare earth element, barium and copper dissolved in an organic solvent is prepared. The organic solvent may be a lower alcohol having 2–4 carbon atoms, a ketone such as acetone or an ether. The acidic solution is then mixed with pyridine and acetylacetone to obtain a neutral solution.

The acidic solution may additionally contains at least one of trifluoroacetic acid or pentafluoropropionic acid salts of calcium and strontium.

The metal complex composition of the present invention is suitably used as a precursor for oxide superconductors, in particular Y123-type or Y124-type superconductors. Namely, by applying an organic solvent solution of the metal complex composition of the present invention (hereinafter referred to as precursor solution) to a surface of a substrate and by heating the resulting coating, a superconductor film may be formed on the substrate.

The precursor solution should contain metal constituents of the oxide superconductor in a stoichiometry nearly equal to the stoichiometry of the oxide superconductor. Thus, for example, when a Y123 type superconductor is prepared, the precursor solution should contain a rare earth element, barium and copper in a proportion nearly equal to 1:2:3. If desired, other metals such as calcium or strontium may be incorporated into the precursor solution to provide Ca-doped or Sr-doped superconductors having controlled critical temperature and critical current density. The amount of such other metals is generally 0–0.2 mole per mole of the rare earth element.

The substrate may be any customarily employed one for the formation of a superconductor film thereon. Examples of the substrate include metals such as silver, nickel and copper; composites of a metal having an oxide layer such as magnesia, nickel oxide or ceria thereon; and ceramics such as alumina, zirconia, magnesia, lanthanum aluminate and strontium titanate. The substrate may have a desired shape such as a plate, a wire, a fiber, a ribbon, a coil, a tube or a rod. The substrate may be a porous material.

In one preferred embodiment, the precursor solution is applied to the substrate by any known method such as by spin coating, spray coating, brush coating or dipping. The resulting coating is dried at room temperature or an elevated temperature under an ambient pressure or a reduced pressure. The dried coating is then heat treated at a temperature and for a period of time sufficient to form a superconductive phase.

The heat treatment is performed by first heating the coating at 200–500° C. in an oxygen-containing atmosphere such as in air or in argon or nitrogen atmosphere containing oxygen so that the organic components are decomposed by combustion (pre-calcination treatment). Steam may be added in the oxygen-containing atmosphere, if desired. The coating and pre-calcination may be repeated until a coating having a predetermined thickness can be obtained. The resulting pre-calcined coating is subsequently calcined at 500–1150° C., preferably 700–1000° C., in a steam-containing atmosphere, such as in a nitrogen, argon or air atmosphere containing steam and, if desired, oxygen. The heat treatment may also be performed under vacuum. The calcination time is generally 0.5 to 24 hours.

In another preferred embodiment, the precursor solution is sprayed over a surface of a substrate which has been heated at a temperature of 100–1,000° C. preferably in an oxygen-containing or an oxygen- and steam-containing atmosphere, to form a layer deposited on the surface. When the substrate has a temperature of 100–200° C., the deposited layer is composed of the metal complexes and a small amount of the solvent. In the case of 200–500° C., the deposited layer is a mixture of the metal complexes and thermal decomposition products thereof. When the temperature of the substrate is 500–1000° C., the deposited layer is composed of a mixture of the decomposition products of the metal complexes and metal oxides. The deposited layer is then calcined at 500–1150° C., preferably 700–1000° C. in a steam- and/or oxygen-containing atmosphere, such as in a nitrogen, argon or air atmosphere containing steam and/or oxygen.

The superconductor film thus prepared has a thickness of generally 0.01 $\mu$m to 20 $\mu$m.

Since the precursor solution, which contains complexes of metal species of a rare earth element, barium and copper having ligands of (a) trifluoroacetic acid or pentafluoropropionic acid, (b) pyridine and (c) acetylacetone coordinated with the metal species, is neutral in nature, the substrate to which the precursor solution is applied is not corroded thereby or dissolved therein. Further, after the coating of the precursor solution is dried and pre-calcined, the precursor solution may be again coated on the pre-calcined coating without corrosion or dissolution thereof. Therefore, the thickness of the coating can be increased in a controlled manner. In addition, since the precursor solution is uniform, the coating obtained by applying the solution is also uniform. Moreover, since the metal ions in the precursor solution are inter-connected by ligands to form a stable structure like a three-dimensional network structure, the precursor solution is stable and permits storage for a long period of time. The stability of the complexes also permits the formation of a superconducting phase without segregation of fine crystals during drying and heat-treatment.

The following examples will further illustrate the present invention.

EXAMPLE 1

Yttrium acetylacetonate, barium acetylacetonate and copper acetylacetonate were mixed with each other to form a mixture having a molar ratio of Y:Ba:Cu of 1:2:3. The resulting mixture was dissolved in pyridine and trifluoroacetic acid. The volume ratio of the pyridine to the trifluoroacetic acid was 10:1. The thus obtained solution was heated at 80° C. under a reduced pressure of about 0.01 atm to remove excess pyridine and trifluoroacetic acid, thereby obtaining a non-crystalline solid of complexes of Y, Ba and Cu having acetylacetone, pyridine and trifluoroacetic acid ligands.

The non-crystalline solid was found to be dissolved in water, methanol or acetone to form a uniform solution. A part of the non-crystalline solid was dissolved in methanol to obtain a methanol solution having a Y content of 0.1–0.2 mmol per 1 g of the solution. The pH of the methanol solution was about 7. The methanol solution was then applied to a silver substrate, a nickel substrate, a nickel substrate covered with a nickel oxide film, a magnesium oxide single crystal ceramic substrate, a strontium titanate single crystal ceramic substrate, a lanthanum aluminate ceramic substrate and a yttria-stabilized zirconia ceramic substrate by a spin coating method. Each of the substrates was found not to be corroded with the methanol solution and was also found to be wetted and coated with the methanol solution. Thus, the uniform coatings having smooth surfaces were obtained on respective substrates.

Each of the coated substrates was heated in air at 500° C. to decompose the organic components of the coating to obtain a pre-calcined film having a thickness of about 0.2 $\mu$m. Each pre-calcined film was an amorphous mixture of oxides and fluorides and did not at all exhibit superconductivity. When a trifluoroacetic acid solution (acidic solution) of Y, Ba and Cu metal salts is applied to a substrate and when the coating is pre-calcined, the pre-calcined coating forms a mixture of oxides and fluorides. In this regard, the above methanol solution is similar to the trifluoroacetic acid solution. However, the methanol solution is distinguished from the trifluoroacetic acid solution in that the former is not an acidic solution but is a neutral solution.

When the above procedures of the application of the methanol solution and succeeding pre-calcination were repeated, the thickness of the coatings was found to increase with an increase of the repetition number. Thus, for example, when the above procedures were repeated 8 times, the thickness of the coating was 1.5 $\mu$m. It was found that the pre-calcined coating was not dissolved in the newly applied methanol solution and that the coating after the repeated application and pre-calcination had a smooth surface.

EXAMPLE 2

The pre-calcined coating formed on the strontium titanate single crystal ceramic substrate in Example 1 was calcined at 760° C. for 2 hours in an argon atmosphere containing steam (dew point at 80° C.) and 100 ppm of oxygen, then at 760° C. for another 2 hours in an argon atmosphere containing 100 ppm of oxygen, and finally at 760° C. for 10 minutes in an oxygen atmosphere. The calcined product was then allowed to cool in the oxygen atmosphere. The X-ray diffraction analysis revealed that the film (thickness: 0.5 $\mu$m) on the substrate had a superconductive single phase of Y123. The superconducting film was found to epitaxially grow on the single crystal substrate and to have a superconductive critical temperature of 91 K and a critical current density of $3\times10^5$ A/cm$^2$ at the liquid nitrogen temperature.

EXAMPLE 3

The pre-calcined coating formed on the lanthanum aluminate single crystal ceramic substrate in Example 1 was calcined in the same manner as that in Example 2. The X-ray diffraction analysis revealed that the film (thickness: 0.5 $\mu$m) on the substrate had a superconductive single phase of Y123. The superconducting film was found to epitaxially grow on the single crystal substrate and to have a superconductive critical temperature of 89 K and a critical current density of $2\times10^5$ A/cm$^2$ at the liquid nitrogen temperature.

EXAMPLE 4

The pre-calcined coating formed on the magnesium oxide single crystal substrate in Example 1 was calcined at 850° C. for 30 minutes in an argon atmosphere containing steam (dew point at 80° C.) and 100 ppm of oxygen, then at 850° C. for 15 minutes in an argon atmosphere containing 100 ppm of oxygen, and finally at 850° C. for 15 minutes in an oxygen atmosphere. The calcined product was then allowed to cool in the oxygen atmosphere. The X-ray diffraction analysis revealed that the film (thickness: 0.5 $\mu$m) on the substrate had a superconductive single phase of Y123. The superconducting film was found to epitaxially grow on the single crystal substrate.

EXAMPLE 5

Yttrium trifluoroacetate, barium trifluoroacetate and copper trifluoroacetate were dissolved in methanol to form a methanol solution having a molar ratio of Y:Ba:Cu of 1:2:3. To the light blue methanol solution, pyridine was added little by little so that the solution turned dark blue. When the resulting solution which had a pH of about 7 was applied to each of the substrates in the same manner as that in Example 1, the solution did not corrode the substrate. Each of the coated substrates was pre-calcined in air at 500° C. and then calcined in the same manner as that in Example 4 to obtain an epitaxially grown Y123 superconductive film on the substrate. The pre-calcined coating was, however, not uniform and smooth. Further, precipitates were formed when the above solution was stored for a few days.

To the above dark blue solution containing complexes of Y, Ba and Cu having pyridine and trifluoroacetic acid ligands, acetylacetone was added little by little until the solution turned dark green. Substantially no change of pH occurred. The resulting solution contained complexes of Y, Ba and Cu having acetylacetone, pyridine and trifluoroacetic acid ligands and was similar to the methanol solution obtained in Example 1. No precipitations were formed even when the solution was stored for a few days. Thus, the acetylacetone ligand was found to serve to stabilize the complex solution.

The above dark green complex solution was applied to a magnesium oxide single crystal substrate and a lanthanum aluminate ceramic substrate by a spin coating method and pre-calcined in air at 500° C. It was found that the pre-calcined coating had a smooth surface. The pre-calcined film was calcined in the same manner as that in Example 4 to obtain an epitaxially grown Y123 superconductive film on each substrate.

EXAMPLE 6

Example 1 was repeated in the same manner as described except that pentafluoropropionic acid was substituted for trifluoroacetic acid to obtain a solution containing complexes of Y, Ba and Cu having acetylacetone, pyridine and pentafluoropropionic acid ligands. Excess pyridine and pentafluoropropionic acid were removed by distillation to obtain solid residues. The residues were dissolved in methanol to obtain a solution having a pH of about 7. The methanol solution was able to be uniformly applied to various substrates likewise in Example 1. The solution was applied to a magnesium oxide single crystal substrate and a lanthanum aluminate ceramic substrate by a spin coating method and pre-calcined in air at 500° C. It was found that the pre-calcined coating had a smooth surface. The pre-calcined film was calcined in the same manner as that in Example 4 to obtain an epitaxially grown Y123 superconductive film on each substrate.

EXAMPLE 7

Example 1 was repeated in the same manner as described except that samarium acetylacetonate was substituted for yttrium acetylacetonate to obtain a solution containing complexes of Sm, Ba and Cu having acetylacetone, pyridine and trifluoropropionic acid ligands. Excess pyridine and trifluoropropionic acid were removed by distillation to obtain solid residues. The residues were dissolved in methanol to obtain a methanol solution having a pH of about 7. The solution was able to be uniformly applied to various substrates likewise in Example 1. The methanol solution was applied to a lanthanum aluminate ceramic substrate by a spin coating method and pre-calcined in air at 500° C. It was found that the pre-calcined coating had a smooth surface. The pre-calcined film was calcined in the same manner as that in Example 4 to obtain an epitaxially grown Sm123 superconductive film on the substrate. The superconductive film had a superconductive critical temperature (Tc) of 85 K.

EXAMPLE 8

Ytterbium trifluoroacetate, barium trifluoroacetate and copper trifluoroacetate were dissolved in methanol to form a methanol solution having a molar ratio of Yb:Ba:Cu of 1:2:4. To the light blue methanol solution, pyridine was added little by little so that the solution turned dark blue. Subsequently, acetylacetone was added little by little to the dark blue solution, so that the solution turned dark green, indicating that complexes of Yb, Ba and Cu having pyridine, acetylacetone and trifluoroacetic acid ligands were formed. The dark green solution was applied to a lanthanum aluminate ceramic substrate by a spin coating method and pre-calcined in air at 500° C. The pre-calcined film was calcined at 770° C. in an oxygen atmosphere containing steam (dew point at 80° C.) to obtain an epitaxially grown Yb124 superconductive film on the substrate.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

The teachings of Japanese Patent Application No. 2001-90925, filed Mar. 27, 2001, inclusive of the specification and claims, are hereby incorporated by reference herein.

What is claimed is:

1. A metal complex composition comprising complexes of metal species comprising a rare earth element, barium and copper, said complexes having ligands of (a) trifluoroacetic acid or pentafluoropropionic acid, (b) pyridine and (c) acetylacetone coordinated with said metal species.

2. A metal complex composition as claimed in claim 1, wherein said metal species further comprise at least one of calcium and strontium.

3. A metal complex composition as claimed in claim 1, further comprising a neutral organic solvent in which said complexes of metal species are dissolved.

4. A metal complex composition as claimed in claim 3, wherein said metal species further comprise at least one of calcium and strontium.

5. A metal complex composition as claimed in claim 1 and in the form of an amorphous solid.

6. A metal complex composition as claimed in claim 5, wherein said metal species further comprise at least one of calcium and strontium.

7. A method of preparing a metal complex composition according to claim 1, comprising the steps of:

(a) providing a solution comprising (A) a rare earth element salt selected from the group consisting of an acetylacetonate, a trifluoroacetate and a pentafluoropropionate, (B) a barium salt selected from the group consisting of an acetylacetonate, a trifluoroacetate and a pentafluoropropionate and (C) a copper salt selected from the group consisting of an acetylacetonate, a trifluoroacetate and a pentafluoropropionate dissolved in a mixed solvent including pyridine and at least one member selected from the group consisting of acetylacetone, trifluoroacetic acid and pentafluoropropionic acid such that said solution contains acetylacetone and at least one of trifluoroacetic acid and pentafluoropropionic acid, and (b) removing the mixed solvent from said solution to obtain a solid phase.

8. A method as claimed in claim 7, wherein step (a) comprises dissolving a mixture containing acetylacetonates of a rare earth element, barium and copper in pyridine and in an organic acid selected from the group consisting of trifluoroacetic acid and pentafluoropropionic acid.

9. A method as claimed in claim 7, wherein step (a) comprises dissolving a mixture containing organic acid salts of a rare earth element, barium and copper in pyridine and in acetylacetone, said organic acid being selected from the group consisting of trifluoroacetic acid and pentafluoropropionic acid.

10. A method as claimed in claim 7, wherein said solution additionally contains at least one salt selected from the group consisting of calcium acetylacetonate, calcium trifluoroacetate, calcium pentafluoropropionate, strontium acetylacetonate, strontium trifluoroacetate and strontium pentafluoropropionate.

11. A method as claimed in claim 7, further comprising dissolving said solid phase in a solvent.

12. A method of preparing a metal complex composition according to claim 1, comprising providing an acidic solution of trifluoroacetic acid or pentafluoropropionic acid salts of a rare earth element, barium and copper dissolved in an organic solvent, and mixing said solution with pyridine and acetylacetone to obtain a neutral solution.

13. A method as claimed in claim 12, wherein said acidic solution additionally contains at least one of trifluoroacetic acid or pentafluoropropionic acid salts of calcium and strontium.

14. A method as claimed in claim 12, wherein said organic solvent is selected from the group consisting of alcohols, ketones and ethers.

15. A method as claimed in claim 12, wherein said organic solvent is methanol.

16. A process for the preparation of an oxide superconductor, comprising the steps of:

(a) applying to a substrate an organic solvent solution of a metal complex composition according to claim 1 having metal constituents of the oxide superconductor in a stoichiometry nearly equal to the stoichiometry of the oxide superconductor to form a coating thereon; and (b) heat treating said coating at a temperature and for a period of time sufficient to form a superconductive phase.

17. A process as claimed in claim 16, wherein said substrate is a member selected from the group consisting of metals, metal oxides and ceramics.

18. A process as claimed in claim 16, wherein said metal complex composition has a molar ratio of RE:Ba:Cu of 1:2:3 or 1:2:4, wherein RE represents the rare earth element.

19. A process as claimed in claim 16, wherein said metal species of said metal complex composition further comprise at least one of calcium and strontium.

20. A process as claimed in claim 16, wherein step (b) comprises heating said coating at a temperature of 200–500° C., followed by calcining at 700–1150° C. in a steam-containing atmosphere.

21. A process as claimed in claim 16, wherein step (a) comprises spraying said solution over a surface of said substrate heated at a temperature of 100–1,000° C. to form a layer deposited on said surface, and wherein step (b) is preceded by step (a) and comprises calcining said layer at 700–1150° C. in a steam-containing atmosphere.

* * * * *